(12) United States Patent
Ueno et al.

(10) Patent No.: US 9,414,529 B2
(45) Date of Patent: Aug. 9, 2016

(54) PORTABLE TERMINAL

(71) Applicant: SHARP KABUSHIKI KAISHA, Osaka-shi, Osaka (JP)

(72) Inventors: Takashi Ueno, Osaka (JP); Yasumasa Miyauchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/404,356

(22) PCT Filed: Jul. 23, 2013

(86) PCT No.: PCT/JP2013/069928
§ 371 (c)(1),
(2) Date: Nov. 26, 2014

(87) PCT Pub. No.: WO2014/021143
PCT Pub. Date: Feb. 6, 2014

(65) Prior Publication Data
US 2015/0173247 A1 Jun. 18, 2015

(30) Foreign Application Priority Data
Aug. 1, 2012 (JP) .................................. 2012-171041

(51) Int. Cl.
*G06F 1/16* (2006.01)
*H05K 7/20* (2006.01)
(Continued)

(52) U.S. Cl.
CPC .......... *H05K 7/20509* (2013.01); *G06F 1/1626* (2013.01); *G06F 1/203* (2013.01); *H04M 1/0262* (2013.01); *H04M 1/0266* (2013.01); *H04M 1/0277* (2013.01); *H05K 7/1422* (2013.01); *H05K 7/20445* (2013.01)

(58) Field of Classification Search
CPC . G06F 1/1601–1/1611; G06F 1/1613–1/1698; G06F 1/18–1/189; H05K 5/00–5/069; H05K 7/00–7/186; H05K 7/20218–7/20381; H05K 7/20409–7/20418; H05K 7/20009–7/202; H01L 23/46–23/3677
USPC ............. 361/679.01–679.45, 679.55–679.61, 361/724–727, 756, 741, 686, 687, 787, 789, 361/794, 807–810, 676–678, 361/679.46–679.54, 688–723; 455/575.1–575.9; 312/223.1–223.3; 348/787, 789, 794; 349/56–60; 165/80.1–80.5, 104.33, 185; 174/15.1–15.3, 16.1–16.3, 547, 548; 257/712–722, E23.088
See application file for complete search history.

(56) References Cited

U.S. PATENT DOCUMENTS

2002/0123375 A1* 9/2002 Shimazaki .......... H04M 1/0202
455/575.8
2004/0132511 A1* 7/2004 Yamamoto .......... H04M 1/0214
455/575.3
(Continued)

FOREIGN PATENT DOCUMENTS

CN 101495946 A 7/2009
JP 2008-198860 A 8/2008

*Primary Examiner* — Anthony Haughton
*Assistant Examiner* — Razmeen Gafur
(74) *Attorney, Agent, or Firm* — Birch, Stewart, Kolasch & Birch, LLP

(57) ABSTRACT

This portable terminal has disposed therein: a circuit board (14), which is disposed in a cabinet (15), and which has an electronic component (14a) mounted thereon; a display panel (11) disposed on the open plane of the cabinet (15); and a rechargeable battery (12) disposed between the display panel (11) and the circuit board (14).

3 Claims, 2 Drawing Sheets

(51) Int. Cl.
*H04M 1/02* (2006.01)
*G06F 1/20* (2006.01)
*H05K 7/14* (2006.01)
*H05K 5/00* (2006.01)
*H05K 7/00* (2006.01)

(56) References Cited

U.S. PATENT DOCUMENTS

| | | | | |
|---|---|---|---|---|
| 2004/0263482 A1* | 12/2004 | Goertz | G06F 3/042 | 345/679.02 |
| 2005/0141186 A1* | 6/2005 | Shimizu | G02F 1/133308 | 361/679.02 |
| 2005/0141187 A1* | 6/2005 | Shimizu | H04M 1/0214 | 361/679.01 |
| 2005/0282594 A1* | 12/2005 | Oldham | H04M 1/0214 | 455/575.3 |
| 2006/0203439 A1* | 9/2006 | Lim | G06F 1/1626 | 361/679.56 |
| 2006/0233356 A1* | 10/2006 | Lu | H04B 1/3838 | 379/433.01 |
| 2006/0281501 A1* | 12/2006 | Zuo | H04M 1/0262 | 455/575.1 |
| 2007/0021156 A1* | 1/2007 | Hoong | H04M 1/026 | 455/575.1 |
| 2008/0019502 A1* | 1/2008 | Emmert | H04M 1/026 | 379/433.07 |
| 2008/0037769 A1 | 2/2008 | Emmert et al. | | |
| 2008/0291647 A1* | 11/2008 | Hirota | H04M 1/026 | 361/752 |
| 2009/0061967 A1* | 3/2009 | Matsuda | H01Q 1/243 | 455/575.7 |
| 2009/0079904 A1* | 3/2009 | Yada | G02F 1/133308 | 349/60 |
| 2009/0137293 A1* | 5/2009 | Yoo | H04N 7/142 | 455/575.4 |
| 2009/0257189 A1* | 10/2009 | Wang | H04M 1/0249 | 361/679.56 |
| 2010/0072952 A1* | 3/2010 | Nakajima | H04B 1/036 | 320/150 |
| 2010/0105452 A1* | 4/2010 | Shin | H04M 1/0277 | 455/575.8 |
| 2010/0273537 A1* | 10/2010 | Jiang | H04M 1/0262 | 455/575.1 |
| 2010/0279694 A1* | 11/2010 | Yagi | H04M 1/0266 | 455/436 |
| 2010/0298027 A1* | 11/2010 | Yun | H01Q 1/243 | 455/553.1 |
| 2011/0021255 A1* | 1/2011 | Kim | H01Q 1/38 | 455/575.1 |
| 2011/0177848 A1* | 7/2011 | Tanabe | G01C 22/006 | 455/575.1 |
| 2011/0183729 A1* | 7/2011 | Satou | H04M 1/0277 | 455/575.1 |
| 2012/0050988 A1* | 3/2012 | Rothkopf | H04M 1/0266 | 361/688 |

* cited by examiner

PORTABLE TERMINAL

TECHNICAL FIELD

The present invention relates to a portable terminal that efficiently radiates heat generated from an electronic component.

BACKGROUND ART

A general portable terminal includes: a display panel; a circuit board on which an electronic component is mounted; and a rechargeable battery that supplies power to the circuit board and the display panel. Besides, the circuit board and the rechargeable battery are housed in a cabinet, and the display panel is disposed on an open surface of the cabinet. Here, the circuit board is disposed on a rear side of the display panel, and the rechargeable battery is disposed on a rear side of the circuit board. And, the electronic component and the display panel operate on the power supplied from the rechargeable battery. However, the electronic component generates heat during use of the portable terminal; accordingly, there is a problem that the heat generated from the electronic component locally travels to the display panel to deteriorate display quality.

A patent document 1 discloses a cooling device for a portable terminal. As to this cooling device, a conductive sheet, which is flexible and excellent in heat conduction in a surface direction, is covered on an electronic component in a cabinet. In this way, heat from the electronic component travels to the cabinet via the conductive sheet, so that the electronic component is cooled.

CITATION LIST

Patent Literature

PLT1: JP-A-2008-198860

SUMMARY OF INVENTION

Technical Problem

However, if the cooling device of the patent document 1 is used in the above portable terminal, the conductive sheet is housed in the cabinet; accordingly, there is a problem that thickness of the portable terminal increases and production cost of the portable terminal rises.

Accordingly, it is an object of the present invention to provide a portable terminal that curbs production cost and efficiently radiates heat generated from an electronic component to prevent deterioration in display quality of a display panel.

Solution to Problem

To achieve the above object, the present invention includes: a circuit board which is disposed in a cabinet and on which an electronic component is mounted; a display panel that is disposed at an open surface of the cabinet; and a rechargeable battery that is disposed between the display panel and the circuit board.

According to this structure, the electronic component and the display panel operate on power supplied from the rechargeable battery. During the operation, heat generated from the electronic component travels from the circuit board to the rechargeable battery. The rechargeable battery has a large heat capacity, and the heat traveling to the rechargeable battery is stored into the rechargeable battery and diffused.

Besides, the portable terminal according to the present invention having the above structure includes a metal plate that extends beyond the circuit board toward an outer circumference and is disposed between the rechargeable battery and the circuit board. According to this structure, the heat generated from the electronic component travels from the circuit board to the metal plate that has a low heat resistance. Here, the metal plate extends beyond the circuit board toward the outer circumference, and the heat traveling to the metal plate diffuses in a surface direction. In this way, the heat is prevented from traveling from the electronic component to the rechargeable battery locally.

Besides, in the portable terminal according to the present invention having the above structure, a mount surface of the circuit board is disposed to oppose a bottom surface of the cabinet, and the bottom surface of the cabinet and the electronic component oppose each other over a gap. According to this structure, air has a high heat resistance compared with the circuit board. Besides, heat travels with ease to a place that has a low heat resistance. Because of this, the heat generated from the electronic component travels from the circuit board to the rechargeable battery, and is unlikely to travel to the opposing bottom surface of the cabinet. Accordingly, the heat generated from the electronic component is prevented from locally traveling to the cabinet.

Advantageous Effects of Invention

According to the present invention, the heat generated from the electronic component travels from the circuit board to the rechargeable battery. The rechargeable battery has the large heat capacity, and the heat traveling to the rechargeable battery is stored into the rechargeable battery and diffused. In this way, the rechargeable battery shuts down the heat traveling from the electronic component to the display panel to prevent the display quality of the display panel from deteriorating. Besides, it is possible to efficiently perform the heat radiation from the electronic component and curb performance deterioration of the electronic component. Besides, it becomes possible to perform the heat radiation from the electronic component by using the rechargeable battery and curb the production cost of the portable terminal.

DESCRIPTION OF EMBODIMENTS

Figure 1:
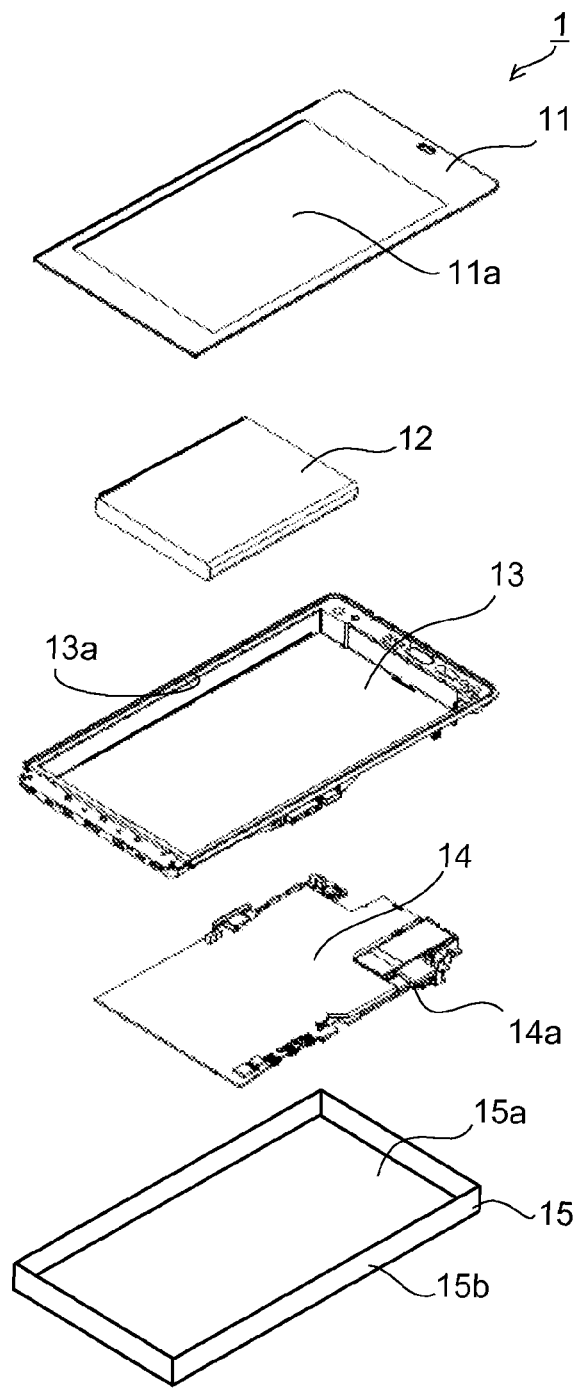
FIG. 1 is an exploded perspective view of a portable terminal according to an embodiment of the present invention.

Hereinafter, the present invention is described based on drawings that show an embodiment. FIG. 1 is an exploded perspective view of a portable terminal 1 according to an embodiment of the present invention.

A surface of the portable terminal 1 is provided with a display panel 11 and a rear side is covered by a cabinet 15. The cabinet 15 is formed of a metal such as aluminum or the like, and is provided with a circumferential wall 15b erected from a circumferential edge of a bottom surface 15a to have a box shape with an upper surface opened. The cabinet 15 houses therein a circuit board 14, a metal plate 13, and a rechargeable battery 12.

As to the circuit board 14, an electronic component 14a is mounted on a mount surface 14b, and the mount surface 14b is disposed to oppose the bottom surface 15a of the cabinet 15. The electronic component 14a has heat generating components such as a CPU (Central Processing Unit), a wireless circuit component, a rechargeable circuit component and the like.

The metal plate 13 is formed of aluminum or the like and fits into an inner surface of the circumferential wall 15b of the cabinet 15 to reinforce the cabinet 15. Besides, the metal plate 13 is formed to extend beyond the circuit board 14 toward an outer circumferential side, and has a circumferential wall 13a erected from a circumferential portion to house the rechargeable battery 12.

The rechargeable battery 12 is formed of a lithium ion battery or the like, and supplies power to each portion of the portable terminal 1. Besides, the rechargeable battery 12 is disposed to contact an upper surface of the metal plate 13.

The display panel 11 is formed of a liquid crystal panel, an organic EL panel or the like, and is disposed on the open surface of the cabinet 15. A surface of the display panel 11 is provided with a touch panel. The display panel 11 displays information and the portable terminal 1 is operated.

Figure 2:
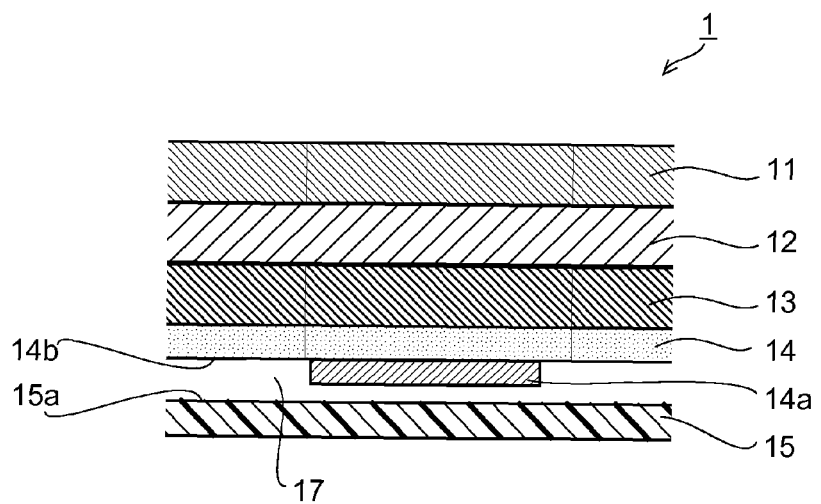
FIG. 2 is a cross-sectional view of a portable terminal according to an embodiment of the present invention.

FIG. 2 is a cross-sectional view of the portable terminal 1. As shown in FIG. 2, the mount surface 14a of the circuit board 14 is disposed to oppose the bottom surface 15a of the cabinet 15, and the electronic component 14a and the bottom surface 15a oppose each other over a gap. Air has a high heat resistance compared with the circuit board 14 and the metal plate 13. Besides, heat travels with ease to a place that has a low heat resistance. Because of this, heat generated form the electronic component 14a travels from the circuit board 14 to the metal plate 13 and the rechargeable battery 12, but is unlikely to travel to the opposing bottom surface 15a of the cabinet 15. Accordingly, it is possible to prevent an outer surface of the cabinet 15 from being heated locally by the heat generated from the electronic component 14a. In this way, it is possible to prevent the outer surface of the cabinet 15 touched by a user from locally rising in temperature.

Besides, the heat, which travels from the circuit board 14 to the metal plate having a low heat resistance, diffuses in a surface direction to travel to the rechargeable battery 12. In this way, it is possible to prevent the heat generated from the electronic component 14a from locally traveling to the rechargeable battery 12. In this way, it is possible to prevent an outer surface of the display panel 11 touched by the user, from locally rising in temperature. Besides, the rechargeable battery 12 has a large heat capacity, and the heat traveling to the rechargeable battery 12 is stored into the rechargeable battery 12 and diffused. In this way, it is possible to prevent the display quality of the display panel 11 from deteriorating by shutting down the heat that travels from the electronic component 14a to the display panel 11. Besides, it is possible to efficiently perform the heat radiation from the electronic component 14a and curb performance deterioration of the electronic component 14a. Besides, it becomes possible to perform the heat radiation from the electronic component 14a by using the rechargeable battery 12 and it is possible to curb the production cost of the portable terminal 1.

According to the present embodiment, the heat generated from the electronic component 14a travels from the circuit board 14 to the rechargeable battery 12. The rechargeable battery 12 has the large heat capacity, and the traveling heat is stored into the rechargeable battery 12 and diffused. In this way, it is possible to prevent the display quality of the display panel 11 from deteriorating by shutting down the heat that travels from the electronic component 14a to the display panel 11.

Besides, by disposing the metal plate 13 between the rechargeable battery 12 and the circuit board 14, the heat generated from the electronic component 14a travels to the metal plate 13. Here, the metal plate 13 extends beyond the circuit board 14 toward the outer circumference, and the heat traveling to the metal plate 13 diffuses in the surface direction. In this way, the heat is prevented from traveling from the electronic component 14 to the rechargeable battery 12 locally.

Besides, the mount surface 14b of the circuit board 14 is disposed to oppose the bottom surface 15a of the cabinet 15, and the bottom surface 15a of the cabinet 15 and the electronic component 14b oppose each other over the gap 17. Air has a high heat resistance compared with the circuit board 14 and the metal plate 13. Besides, heat travels with ease to a place that has a low heat resistance. Because of this, the heat generated from the electronic component 14a travels from the circuit board 14 to the rechargeable battery 12, but is unlikely to travel to the opposing bottom surface 15a of the cabinet 15. Accordingly, the heat generated from the electronic component 14a is prevented from locally traveling to the cabinet 15. In this way, it is possible to prevent the outer surface of the cabinet 15 touched by the user from locally rising in temperature.

INDUSTRIAL APPLICABILITY

The present invention is widely applicable to various portable terminals such as a PDA, a schedule management apparatus, a game machine and the like.

REFERENCE SIGNS LIST 1 portable terminal
11 display panel
12 rechargeable battery
13 metal plate
14 circuit board
14a electronic component
14b mount surface
15 cabinet
15a bottom surface
17 gap

The invention claimed is:

1. A portable terminal comprising:
a circuit board which is disposed in a cabinet and on which an electronic component is mounted,
a display panel that is disposed at an open surface of the cabinet,
a rechargeable battery that is disposed between the display panel and the circuit board, and
a metal plate that extends be and the circuit board toward an outer circumference and is disposed between the rechargeable battery and the circuit board.

2. The portable terminal according to claim 1, wherein a mount surface of the circuit board is disposed to oppose a bottom surface of the cabinet, and the bottom surface of the cabinet and the electronic component oppose each other over a gap.

3. The portable terminal according to claim 1, wherein the metal plate has a circumferential wall erected from a circumferential portion thereof so as to fit into an inner surface of a circumferential wall of the cabinet, and one surface of the rechargeable battery is in planar contact with a surface of the metal plate that faces the display panel.

* * * * *